(12) United States Patent
Arimilli et al.

(10) Patent No.: US 6,606,680 B2
(45) Date of Patent: Aug. 12, 2003

(54) METHOD AND APPARATUS FOR ACCESSING BANKED EMBEDDED DYNAMIC RANDOM ACCESS MEMORY DEVICES

(75) Inventors: Ravi Kumar Arimilli, Austin, TX (US); James Stephen Fields, Jr., Austin, TX (US); Sanjeev Ghai, Round Rock, TX (US); Praveen S. Reddy, Austin, TX (US); William John Starke, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 09/895,224

(22) Filed: Jun. 29, 2001

(65) Prior Publication Data

US 2003/0005211 A1 Jan. 2, 2003

(51) Int. Cl.$^7$ ............................ G06F 12/02; G06F 12/14
(52) U.S. Cl. ............................ 711/5; 711/105; 711/110; 711/152
(58) Field of Search ............................ 711/5, 105, 109, 711/152, 163, 170, 110; 365/193, 230.03, 240

(56) References Cited

U.S. PATENT DOCUMENTS

| | | | | |
|---|---|---|---|---|
| 5,323,489 A | * | 6/1994 | Bird | 711/167 |
| 5,787,267 A | * | 7/1998 | Leung et al. | 711/105 |
| 6,092,165 A | * | 7/2000 | Bolyn | 711/167 |
| 6,215,497 B1 | * | 4/2001 | Leung | 345/419 |
| 6,226,738 B1 | | 5/2001 | Dowling | |
| 6,425,044 B1 | * | 7/2002 | Jeddeloh | 711/5 |
| 2002/0031035 A1 | * | 3/2002 | Tsuji et al. | 365/230.03 |

* cited by examiner

Primary Examiner—Gary Portka
(74) Attorney, Agent, or Firm—Casimer K. Salys; Bracewell & Patterson, L.L.P.

(57) ABSTRACT

An apparatus for accessing a banked embedded dynamic random access memory device is disclosed. The apparatus for accessing a banked embedded dynamic random access memory (DRAM) device comprises a general functional control logic and a bank RAS controller. The general functional control logic is coupled to each bank of the banked embedded DRAM device. Coupled to the general functional control logic, the bank RAS controller includes a rotating shift register having multiple bits. Each bit within the rotating shift register corresponds to each bank of the banked embedded DRAM device. As such, a first value within a bit of the rotating shift register allows accesses to an associated bank of the banked embedded DRAM device, and a second value within a bit of the rotating shift register denies accesses to an associated bank of the banked embedded DRAM device.

18 Claims, 4 Drawing Sheets

METHOD AND APPARATUS FOR ACCESSING BANKED EMBEDDED DYNAMIC RANDOM ACCESS MEMORY DEVICES

RELATED PATENT APPLICATION

This patent application is related to a copending application U.S. Ser. No. 09/895,225 filed on even date, entitled "METHOD AND APPARATUS FOR ALLOCATING DATA USAGES WITHIN AN EMBEDDED DYNAMIC RANDOM ACCESS MEMORY DEVICE".

BACKGROUND OF THE INVENTION

1. Technical Field

The present invention relates to memory devices in general, and in particular to embedded dynamic random access memory devices. Still more particularly, the present invention relates to a method and apparatus for accessing a banked embedded dynamic random access memory device.

2. Description of the Prior Art

Generally speaking, many different types of memory devices are employed within a digital computer system. One type of memory devices that is well-known in the art is dynamic random access memory (DRAM) devices. DRAM devices are commonly utilized for storing large increments of data, and the stored data can be accessed in any order. However, a DRAM device cannot be accessed when the DRAM device is being refreshed. Another type of memory devices that is well-known in the art is static random access memory (SRAM) devices. SRAM devices store information in logic circuits known as flip-flops that retain data without requiring any refresh. Thus, although SRAM devices do not have delay states associated to refresh cycles such as DRAM devices, SRAM devices are more complex than DRAM devices.

Yet another type of memory devices is called embedded DRAM devices. Embedded DRAM devices are a type of memory devices having both memory cells and their respective control circuits formed on a single semiconductor chip. Embedded DRAM devices are capable of transferring a large quantity of data at a very high speed. Because of their relatively high processing speed and storage capacity, embedded DRAM devices have been commonly employed in various high-end data processing systems, such as graphics processing systems. In addition, embedded DRAM devices can provide a processor a faster access to a relatively large capacity of on-chip memory at a lower cost than that currently available using conventional embedded SRAM devices and/or electrically erasable programmable read only memory (EEPROM) devices.

Both DRAM devices and embedded DRAM devices are formed in memory arrays having multiple memory locations. Each memory location of the memory arrays is identified by its memory address. When a memory location of the memory array is to be accessed, the address of the memory location can be provided to a decoder circuitry of the memory device, as is well-known in the art. The decoder circuitry decodes the address signal applied thereto in order to permit access to the memory location identified by the address signal. Typically, multiple banks of an embedded DRAM device may be placed together such that a single embedded DRAM controller can provide access control to each bank of the embedded DRAM device and routes addresses to a corresponding bank of memory within a banked cache memory.

The present disclosure provides an improved method for accessing a banked embedded DRAM device.

SUMMARY OF THE INVENTION

In accordance with a preferred embodiment of the present invention, an apparatus for accessing a banked embedded dynamic random access memory (DRAM) device comprises a general functional control logic and a bank RAS controller. The general functional control logic is coupled to each bank of the banked embedded DRAM device. Coupled to the general functional control logic, the bank RAS controller includes a rotating shift register having multiple bits. Each bit within the rotating shift register corresponds to each bank of the banked embedded DRAM device. As such, a first value within a bit of the rotating shift register allows accesses to an associated bank of the banked embedded DRAM device, and a second value within a bit of the rotating shift register denies accesses to an associated bank of the banked embedded DRAM device.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
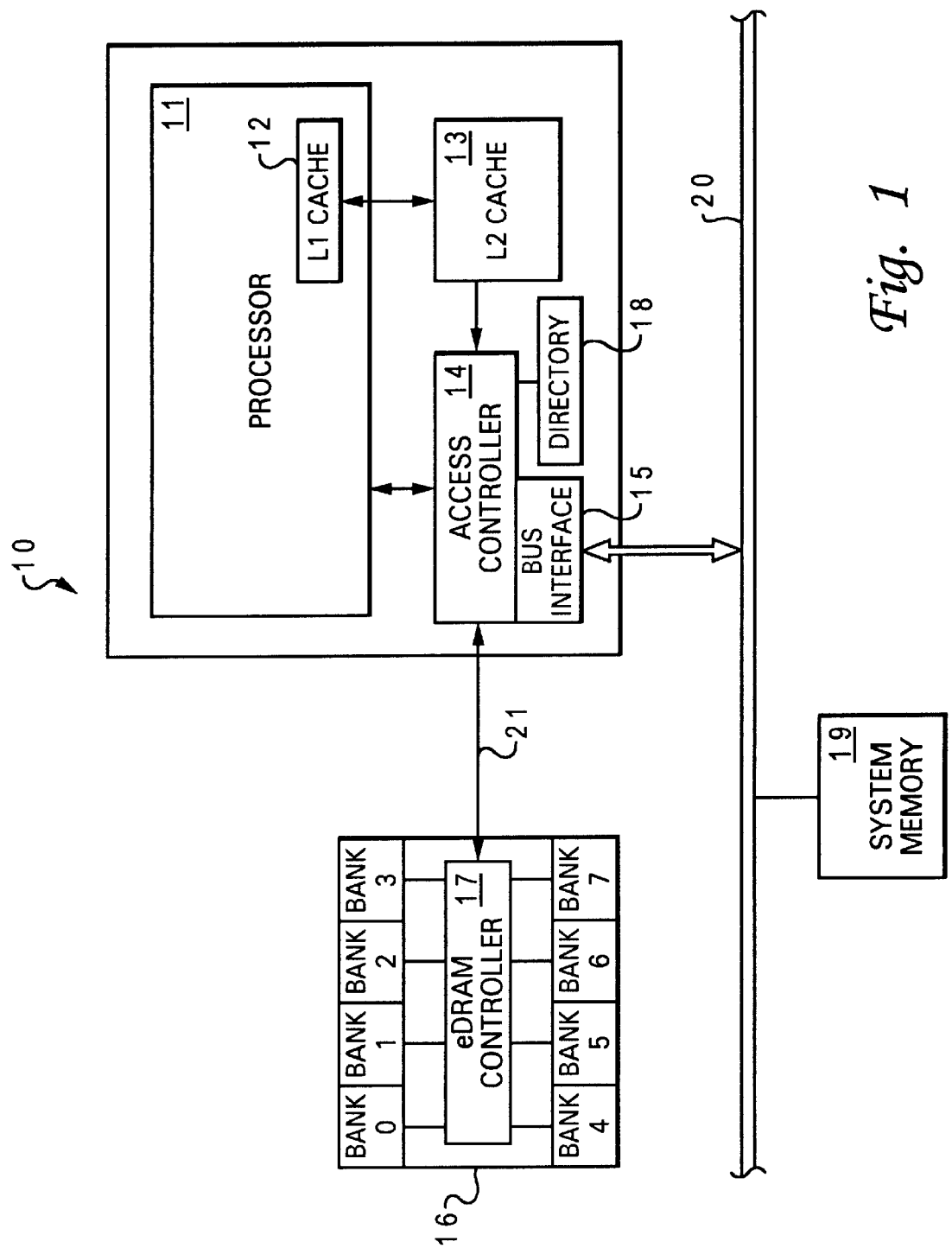
FIG. 1 is a block diagram of a data processing system having several banks of embedded DRAMs, in accordance with a preferred embodiment of the present invention.

Referring now to the drawings and in particular to FIG. 1, there is depicted a block diagram of a data processing system having several banks of embedded dynamic random access memories (DRAMs), in accordance with a preferred embodiment of the present invention. As shown, a data processing system 10 includes a processor 11 with access to data stored in a level-one (L1) cache memory 12 and a level-two (L2) cache memory 13. An access controller 14 directs address requests and data within data processing system 10. A bus interface 15 interfaces with a system interconnect 20 to control the flow of data and addresses between access controller 14 and system interconnect 20. System interconnect 20 provides multiple buses for transporting data and addresses between other components, such as a system memory 19, within data processing system 10. While not depicted, it is understood by those skilled in the art that multiple processors having associated levels of cache memories may be connected along system interconnect 20 within data processing system 10.

Access controller 14 also directs address requests and data to an embedded DRAM controller 17 within banks of embedded DRAM 16 via an interconnect 21. As shown, banked embedded DRAM 16 is depicted as a banked cache, however, other applications for banked embedded DRAM 16 may also be applicable. Banked embedded DRAM 16 includes bank 0 through bank 7, and the total memory provided by banked embedded DRAM 16 is substantially larger than that provided by L2 cache memory 13. For example, L2 cache memory 13 may include two Mbytes of static random access memories (SRAMs) while banked embedded DRAM 16 may include 16 Mbytes of embedded DRAMs. However, accesses to L2 cache memory 13 typically have lower latency than accesses to banked embedded DRAM 16 since L2 cache memory 13 is resided on-chip. Embedded DRAM controller 17 provides access controls to each bank of embedded DRAM 16. Interconnect 21 preferably includes multiple buses by which address requests and data may be transmitted between access controller 14 and embedded DRAM controller 17.

A snoop path is provided from access controller 14 to each of the above-mentioned cache memories. For an address request received at access controller 14, a snoop of each of the cache memories is performed to determine if there is a "hit" in any of the cache memories by the address request. For example, during cache memory snooping, access controller 14 snoops a directory 18. If a "hit" is returned from snooping directory 18, access controller 14 transmits the address request to banked embedded DRAM 16, indicating which bank of banked embedded DRAM 16 contains the data to be accessed by the address request. Once the address request is received at a controller (not shown), the address request is passed to the bank of banked embedded DRAM 16 via interconnect 21.

If there is not a "hit" in the cache memories returned from the snoop, access controller 14 may send the address request to system memory 19, and the address request is received by a system memory controller (not shown). Typically, accesses to system memory 19 are relatively slow because of the remoteness of system memory 19. However, by utilizing an additional memory, implemented by banked embedded DRAM 16 in this example, large amounts of data can be accessed at each processor cycle.

Figure 2:
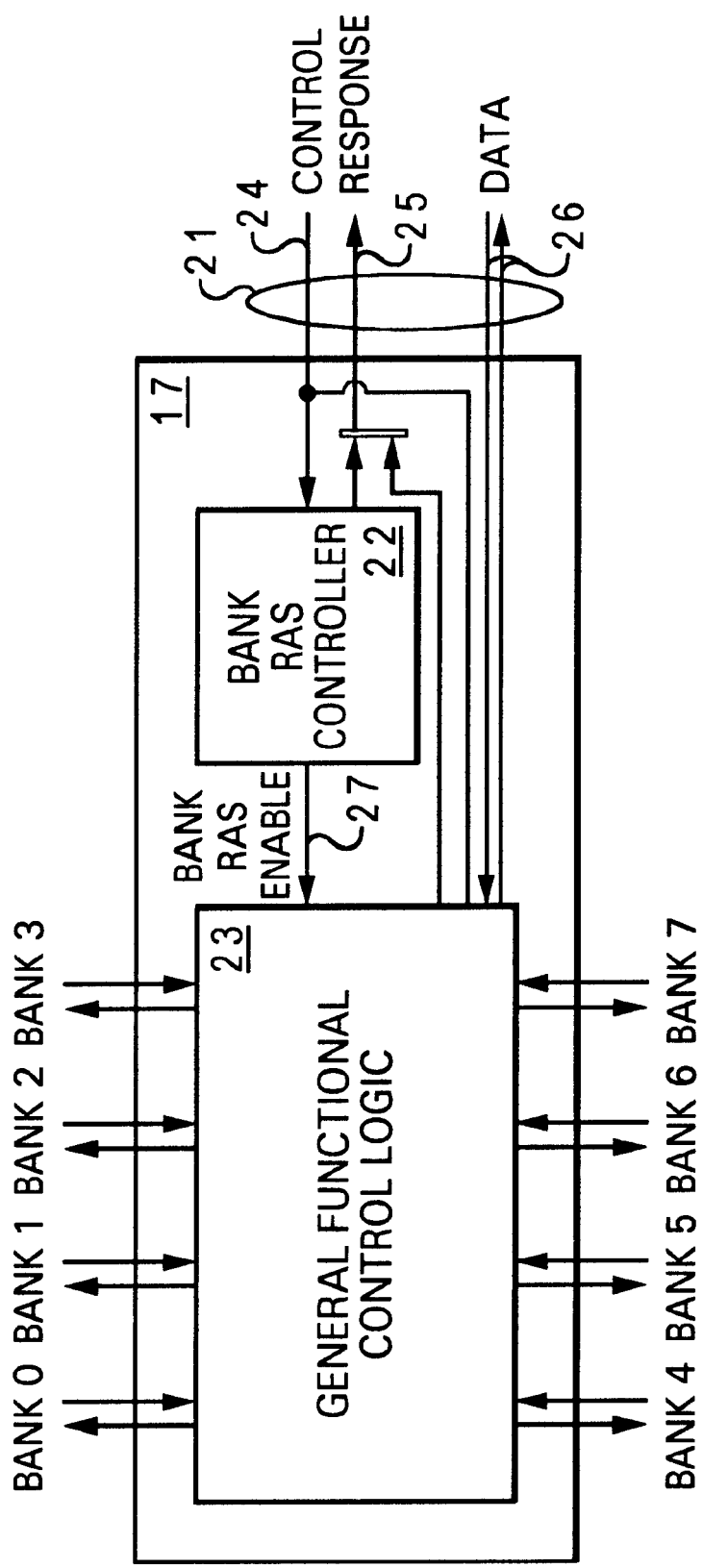
FIG. 2 is a block diagram of an embedded DRAM controller within the data processing system from FIG. 1, in accordance with a preferred embodiment of the present invention.

With reference now to FIG. 2, there is illustrated a block diagram of embedded DRAM controller 17 from FIG. 1, in accordance with a preferred embodiment of the present invention. As shown, embedded DRAM controller 17 includes a bank RAS controller 22 and a general function control logic 23. Embedded DRAM controller 17 is coupled to access controller 14 (from FIG. 1) via interconnect 21. Interconnect 21 preferably includes an address request control bus 24, a response bus 25, a data bus 26. General function control logic 23 includes multiple sets of data buses, with each set of data buses connecting to a corresponding bank of banked embedded DRAM 16, as is well-known to those skilled in the art. Bank RAS controller 22 controls general functional control logic 23 via a bank RAS enable line 27.

Figure 3:
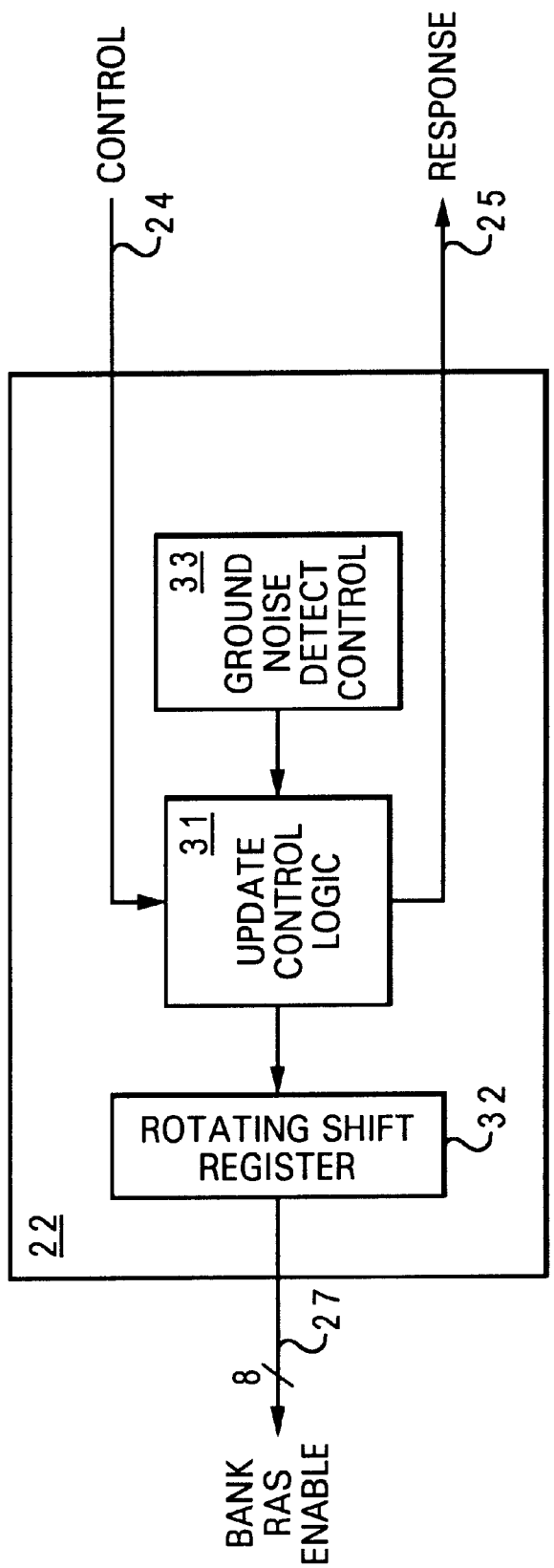
FIG. 3 is a block diagram of a bank RAS controller within the embedded DRAM controller from FIG. 2, in accordance with a preferred embodiment of the present invention.

Referring now to FIG. 3, there is illustrated a block diagram of bank RAS controller 22 within embedded DRAM controller 17 from FIG. 2, in accordance with a preferred embodiment of the present invention. As shown, bank RAS controller 22 includes an update control logic 31, a rotating shift register 32, and a ground noise detector 33. In response to a control signal from a control bus 24, update control logic 31 provides an eight-bit address to rotating shift register 32. Each of the eight-bit output from rotating shift register 32 signifies an access to one of the corresponding eight banks in embedded DRAM 16 (from FIG. 2). For example, bit 0 from rotating shift register 32 corresponds to bank 0 of embedded DRAM 16, bit 1 from rotating shift register 32 corresponds to bank 1 of embedded DRAM 16, bit 2 from rotating shift register 32 corresponds to bank 2 of embedded DRAM 16, etc. Hence, when bit 0 of rotating shift register 32 contains a logical "1" means bank 0 of embedded DRAM 16 may be accessed, and when both bit 0 and bit 2 of rotating shift register 32 contain a logical "1" means both bank 0 and bank 2 of embedded DRAM 16 may be accessed.

Figure 4:
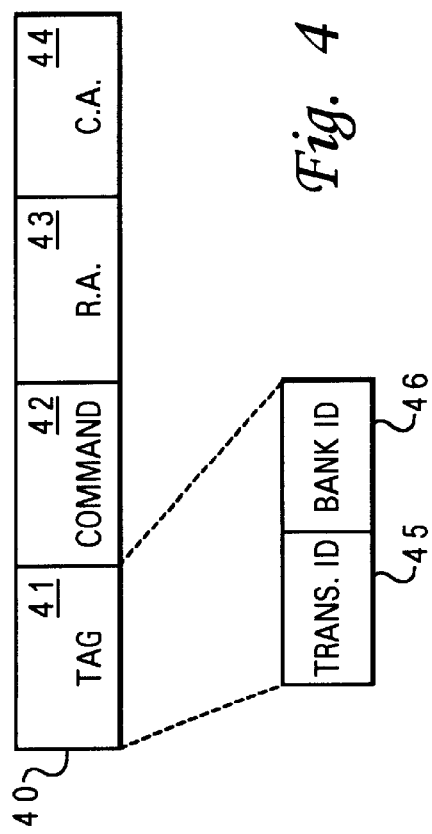
FIG. 4 is a block diagram of a control command, in accordance with a preferred embodiment of the present invention.

Each transaction transmitted within control bus 24 is in form of a control command as depicted in FIG. 4. As shown in FIG. 4, a control command 41 preferably includes a tag field 41, a command field 42, a row address field 43, and a column address field 44. Tag field 41 further includes a transaction identification field 45 and a bank identification field 46. Transaction identification field 45 contains an identification number that is unique to each transaction within a data processing system. Bank identification field 46 specifies a bank number of a banked embedded DRAM, such as any one of bank 0 through bank 7 in banked embedded DRAM 16, at which the transaction should be accessed. Command field 42 contains a command, such as read or write, for the transaction. Row address field 43 and column address field 44 contain the row and the column of the bank at which the transaction should be accessed.

Figure 5:
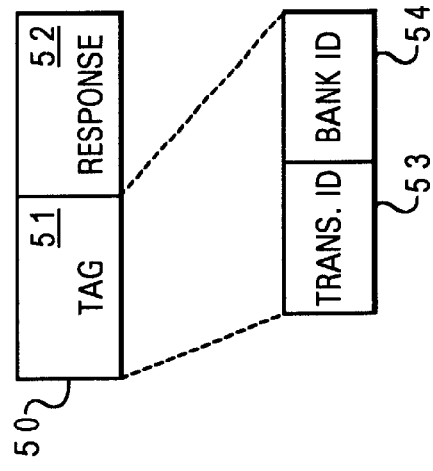
FIG. 5 is a block diagram of a response, in accordance with a preferred embodiment of the present invention.

After completing each transaction, general functional control logic 23 generates a response on response bus 25. As shown in FIG. 2, the response from general functional control logic 23 is merged with the response from update control logic 31. Each response transmitted within response bus 25 is in form of a response as depicted in FIG. 5. As shown in FIG. 5, a response 51 preferably includes a tag field 51 and a response field 52. Tag field 51 also includes a transaction identification field 53 and a bank identification field 54, which serve the same functions as transaction identification field 45 and bank identification field 46 from FIG. 4, respectively. Response field 52 includes the status of the corresponding transactions, such as "write complete" or "read data valid."

Update control logic 31 (from FIG. 3) may update rotating shift register 32 through either a software, hardware, or software/hardware intervention. During a software intervention, processor 11 (from FIG. 1) communicates to access controller 14 (from FIG. 1) to send a control command on control bus 24 to banked embedded DRAM 16 (from FIG. 1). The control command, with the command type indicated in the command field, informs update control logic 31 that rotating shift register 32 needs a new value. Update control logic 31 then processes the request in the control command and updates all eight bits of rotating shift register 32 with a new value that is contained in the row address field of the control command. The format of a control command for updating rotating shift register 32 is very similar to the control command shown in FIG. 4. Instead of having both transaction identification field 45 and bank identification field 46, a control command for updating rotating shift register 32 preferably contains a longer bank identification field 46 (at least 8 bits in the present example) in order to specify more than one bank within banked embedded DRAM 16 to be activiated, if necessary.

For a hardware intervention, ground noise detect control circuit 33 first detects a bounce in the ground plane of banked embedded DRAM 16. When such noise is detected, ground noise detect control 33 then communicates a request for update control logic 31 to change the value of rotating shift register 32 as well as the value (i.e., the number of banks that should be simultaneously activated) for the update. Update control logic 31 subsequently processes the hardware request and updates all eight bits of rotating shift register 32 to a new value specified by ground noise detect control 33. The value (or the number of banks that should be simultaneously activated is preferably dependant upon the level of bounce in the ground plane of banked embedded DRAM 16. The higher the level of bounce in the ground plane of banked embedded DRAM 16, the less number of banks within banked embedded DRAM 16 should be simultaneously activated.

For a hardware/software intervention, ground noise detect control 33 first detects a bounce in the ground plane of banked embedded DRAM 16. When such noise is detected, ground noise detect control 33 then communicates an alert to update control logic 31. Such alert is passed back to processor 11 through response bus 25. At this point, the software may choose to update rotating shift register 32 by sending a control command from access controller 14 via control bus 24 to banked embedded DRAM 16 in a similar fashion as the above-described software intervention update. Upon receiving such a control command, update control logic 31 then processes rotating shift register 32 update in the same fashion as the above-described software intervention update.

Rotating shift register 32 allows or denies general functional control logic 23 the ability to access a specific bank within banked embedded DRAM 16. The register value stored with rotating shift register 32 determines at most how many banks within banked embedded DRAM 16 may be activated at any particular processor cycle. The limiting of bank activation within banked embedded DRAM 16 decreases the probability of a bounce in the ground plane of banked embedded DRAM 16. With the register value within rotating shift register 32 being rolled every cycle, different banks of banked embedded DRAM 16 are enabled and disabled for accesses. Should a read or write command sent by processor 11 through access controller 14 across control bus 24 targets a specific bank within banked embedded DRAM 16 whose RAS enable bit from rotating shift register 32 indicates that such bank is disabled, general functional control logic 23 will hold and delay the execution of the read or write command. Once the RAS enable bit from rotating shift register 32 indicates that the targeted bank is enabled, then general functional control logic 23 may execute the pending read or write command.

As has been described, the present invention provides an improved method and apparatus for accessing banked embedded DRAMs.

While the invention has been particularly shown and described with reference to a preferred embodiment, it will be understood by those skilled in the art that various changes in form and detail may be made therein without departing from the spirit and scope of the invention.

What is claimed is:

1. An apparatus for accessing a banked embedded dynamic random access memory (DRAM) device, said apparatus comprising:
   a general functional control logic coupled to each bank of said banked embedded DRAM device; and
   a bank RAS controller, coupled to said general functional control logic, wherein said bank RAS controller includes a rotating shift register having multiple bits, wherein each bit within said rotating shift register corresponds to each bank of said banked embedded DRAM device, such that a first value within a bit of said rotating shift register allows accesses to an associated bank of said banked embedded DRAM device, and a second value within a bit of said rotating shift register denies accesses to an associated bank of said banked embedded DRAM device.

2. The apparatus according to claim 1, wherein said bank RAS controller further includes an update control logic coupled to said rotating shift register, wherein bit values within said rotating shift register is set by said update control logic via software.

3. The apparatus according to claim 2, wherein said banked embedded DRAM device is updated by said bank RAS controller via a control command.

4. The apparatus according to claim 1, wherein said bank RAS controller further includes an update control logic and a ground noise detect control coupled to said rotating shift register, wherein bit values within said rotating shift register is set by said update control logic via said ground noise detect control.

5. The apparatus according to claim 4, wherein bit values within said rotating shift register is set according to a level of detected ground bounce.

6. The apparatus according to claim 4, wherein said banked embedded DRAM device is updated by said bank RAS controller via a control command.

7. A data processing system comprising:
   a processor;
   a banked embedded DRAM device; and
   an embedded DRAM controller, coupled said banked embedded DRAM device to said processor, for controlling said banked embedded DRAM device, wherein said embedded DRAM controller further includes:
      a general functional control logic coupled to each bank of said banked embedded DRAM device; and
      a bank RAS controller, coupled to said general functional control logic, wherein said bank RAS controller includes a rotating shift register having multiple bits, wherein each bit within said rotating shift register corresponds to each bank of said banked embedded DRAM device, such that a first value within a bit of said rotating shift register allows accesses to an associated bank of said banked embedded DRAM device, and a second value within a bit of said rotating shift register denies accesses to an associated bank of said banked embedded DRAM device.

8. The data processing system according to claim 7, wherein said bank RAS controller further includes an update control logic coupled to said rotating shift register, wherein bit values within said rotating shift register is set by said update control logic via software.

9. The data processing system according to claim 8, wherein said banked embedded DRAM device is updated by said bank RAS controller via a control command.

10. The data processing system according to claim 7, wherein said bank RAS controller further includes an update control logic and a ground noise detect control coupled to said rotating shift register, wherein bit values within said rotating shift register is set by said update control logic via said ground noise detect control.

11. The data processing system according to claim 10, wherein bit values within said rotating shift register is set according to a level of detected ground bounce.

12. The data processing system according to claim 10, wherein said banked embedded DRAM device is updated by said bank RAS controller via a control command.

13. A method for accessing a banked embedded dynamic random access memory (DRAM) device, said method comprising:
- coupling each bank of said banked embedded DRAM device to a bank RAS controller with a rotating shift register having multiple bits; and
- associating each bit within said rotating shift register to each bank of said banked embedded DRAM device, such that a first value within a bit of said rotating shift register allows accesses to an associated bank of said banked embedded DRAM device, and a second value within a bit of said rotating shift register denies accesses to an associated bank of said banked embedded DRAM device.

14. The method according to claim 13, wherein said method further includes a step of setting bit values within said rotating shift register by software.

15. The method according to claim 14, wherein said method further includes a step of updating said banked embedded DRAM device via a control command.

16. The method according to claim 13, wherein said method further includes a step of setting bit values within said rotating shift register by hardware.

17. The method according to claim 16, wherein said method further includes a step of setting bit values within said rotating shift register according to a level of detected ground bounce.

18. The method according to claim 16, wherein said method further includes a step of updating said banked embedded DRAM device via a control command.

* * * * *